(12) United States Patent
Fernandez

(10) Patent No.: US 6,353,188 B1
(45) Date of Patent: Mar. 5, 2002

(54) PRINTED CIRCUIT ASSEMBLY WITH FLEXIBLE SUPPORT

(75) Inventor: Salvador Gomez Fernandez, Tarragona (ES)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 09/365,668

(22) Filed: Aug. 2, 1999

(30) Foreign Application Priority Data

Feb. 5, 1997 (ES) ................................ 9700225

(51) Int. Cl.$^7$ .............................. H05K 1/00; H05K 1/03
(52) U.S. Cl. ...................... 174/255; 174/254; 174/259; 174/268; 361/749; 361/751
(58) Field of Search ................. 174/255, 254, 174/256, 259, 258, 268; 361/749, 751

(56) References Cited

U.S. PATENT DOCUMENTS

| | | | |
|---|---|---|---|
| 2,997,521 A | | 8/1961 | Dahlgren |
| 3,168,617 A | * | 2/1965 | Richter .................. 174/117 FF |
| 4,550,357 A | * | 10/1985 | Matsumoto ................. 361/749 |
| 4,562,119 A | * | 12/1985 | Darms et al. ............... 428/458 |
| 4,716,259 A | * | 12/1987 | Tokura ....................... 174/254 |
| 5,084,124 A | * | 1/1992 | Taniguchi ................... 156/315 |
| 5,257,718 A | * | 11/1993 | Chiu ........................ 228/179.1 |
| 5,525,760 A | * | 6/1996 | Rohatgi et al. ............. 174/254 |
| 5,612,511 A | * | 3/1997 | Meyer et al. ............... 174/254 |
| 5,903,440 A | * | 5/1999 | Blazier et al. ............. 361/749 |
| 5,917,158 A | * | 6/1999 | Takao et al. ................ 174/254 |
| 6,001,489 A | * | 12/1999 | Miyaake et al. ............ 428/458 |
| 6,015,607 A | * | 1/2000 | Fraivillig .................... 428/214 |

OTHER PUBLICATIONS

T. Watanabe, et al., Copper Clad Laminated Boards for Flexible Printed Circuits, Japan Plastics Age, vol. 10, No. 8, Aug. 1972, pp 53–56.
W. Engelmaier, "Improving the Design for Flexibility in Flex Circuits", Proceedings of the Intennepcon and International Microelectronics, 1974, pp 17 and 19.

* cited by examiner

Primary Examiner—Jeffrey Gaffin
Assistant Examiner—I B Patel
(74) Attorney, Agent, or Firm—MacMillan Sobanski & Todd, LLC

(57) ABSTRACT

A circuit assembly having a plurality of tracks formed from a conductive material secured to a flexible substrate by an adhesive. The adhesive is selected to withstand high temperatures and strains caused by folding the flexible substrate.

3 Claims, 1 Drawing Sheet

PRINTED CIRCUIT ASSEMBLY WITH FLEXIBLE SUPPORT

BACKGROUND OF THE INVENTION

This invention generally relates to a printed circuit assembly having a flexible, non-conductive substrate.

By printed circuit it is understood a term that actually is considered generic applied to a method for the manufacturing of electric circuits, formed by conductors and electronic components, resistances, inductancies and capacitances and other using any of the processes of the printing art. The printing processes most commonly employed in printed circuit manufacturing can be divided in three great groups; material removal processes, film deposit processes and molding and embossing processes.

The support element of electronic components in most cases is a stiff non-conductive plate, on which is deposited a thin layer of conductive material in such a way that makes the interconnections needed between components.

Spanish Patent No. 9,200,325 (having common ownership with this application) discloses a process for the manufacturing of a service box, and the Spanish Patent No. 9,501,610 (commonly owned with this application) discloses a system for integrating double printed circuits (i.e., printed in both faces) with the possibility of interconnecting two or more plates. Those patents also discuss the possibility of machining a longitudinal strip in the insulating support in order to be able to fold the conductive portion and thus be able to shape several architectures that can be adapted to the service box, which in turn show an external design in agreement with the wall or surface of the vehicle where the circuits will be used.

SUMMARY OF THE INVENTION

The present invention includes substituting the rigid substrate or insulating plate of the prior art with totally flexible substrates of polyester, polyamide, FR-4, CEM-1 or other materials of the same family that have a great flexure capacity and allow the adherence of a copper conductive coat, up to 800 microns, such that it can withstand the heat produced because of the circulation of power through the conductive portion and generation of a thermal increase, and does not delaminate from the elastic and flexible support.

Experiments performed in the laboratory indicate that the preferred embodiment includes flexibility that goes together with a specific design of the various tracks that integrate the copper conductive layer. When these are configured substantially perpendicular to the longitudinal edges of the support, the deformation strain is reduced since it involves very little surface of the conductive material. This feature does not make the design of the circuit or tracks more difficult since a mechanical folding gives a solution to this need of a bigger strain, therefore the design of the tracks can be performed with any type of configuration, the strain of the folding not being a problem when manufacturing this type of printed circuits.

The design and manufacturing of this new type of printed circuits represents on the other hand the possibility for adapting the several components to the service boxes. The inventive assembly allows the combination with layouts in which the dielectric supports are rigid, enabling the assembly of several types of circuits (of rigid and flexible support) by the customary means, such as short pins, long female pins and every other element facilitating the assembly as well as the integration.

Other details and features of the present invention will appear during the detailed description that follows, where reference is made to the Figures. The details are given as an example only, referring to a case of a practical embodiment. The following description must be considered from an illustrative point of view and without any limitations whatsoever.

DETAILED DESCRIPTION OF THE PREFERRED EMBODIMENT

Figure 1:
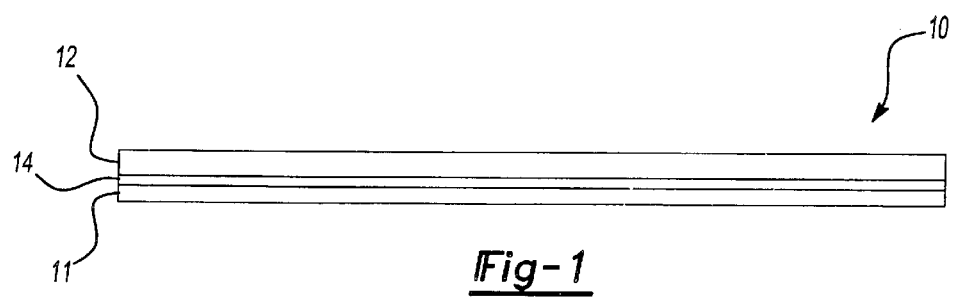
FIG. 1 is a longitudinal, elevational side view of a printed circuit, manufactured as per the improvements of the present invention.

As can be seen in FIG. 1, the printed circuit 10 is manufactured starting with a flexible dielectric support 11 on which, and by conventional procedures, is adhered a coat of conductive material 12, formed by tracks 13. An adhesive 14, preferably of special temperature resistance in order to avoid the effect of high temperatures on the adhesive, bonds the conductive material 12 to the flexible support 11. The adhesive must be able to support folding strains and, in some cases, to withstand torsion especially when the conductive layer is up to 800 microns thick. The adhesive should not be subject to the so-called delamination effect (i.e., the separation of the conductive material 12 from the support 11) because of lack of adherence between both layers.

Figure 2:
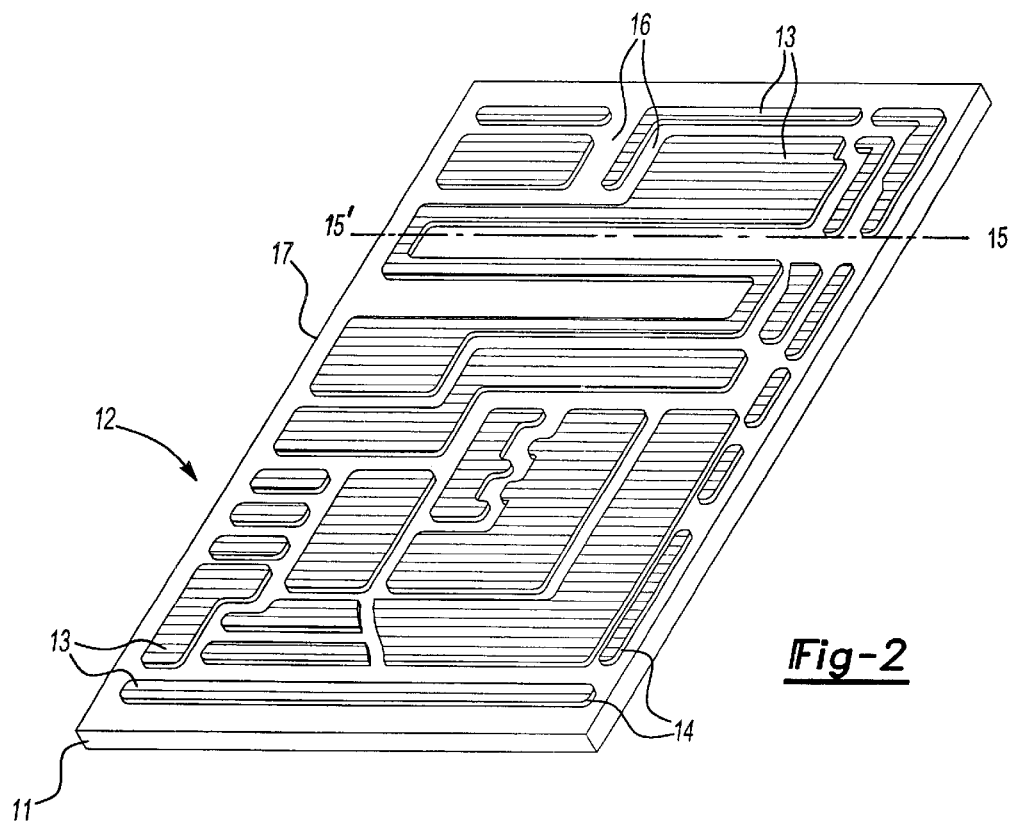
FIG. 2 is a perspective view of the arrangement of FIG. 1.

The configuration of the tracks 13 forming the conductive layer 12, will determine the amount of effort required for folding the circuit 10. For example, the design shown in FIG. 2, shows that aligning the tracks 13 perpendicular to the edges 17 in combination with the folding line 15–15' will determine the amount of flexibility of the whole assembly. The void zones or between-tracks 16 in the circuit function as a hinge allowing the folding by hand at the line 15–15'. Automatic folding of the assembly 10 is not excluded if the manufacturing needs require automation. Designing the tracks 13 is not a problem even to accommodate folding. Further, it is relatively easy to design the assembly to include folding lines in combination with the between-tracks 16.

Figure 3:
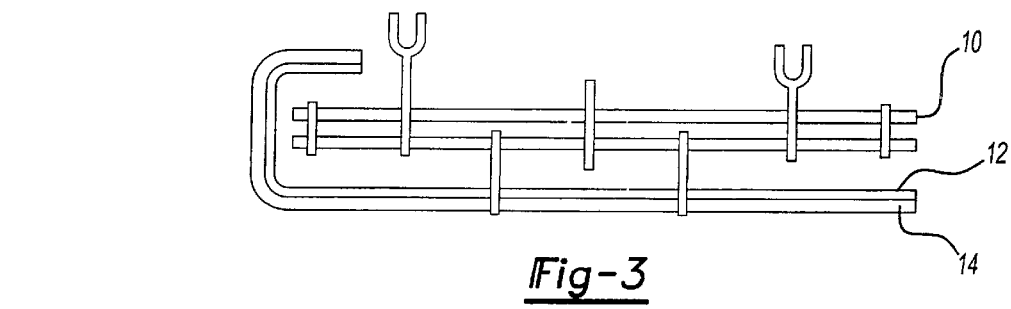
FIG. 3 is a side view in elevation of a possible architecture of a combination of a rigid support circuit with a flexible support circuit.

The use of this technology in the manufacturing of the so-called service boxes such as described in the U.S. Pat. No. 9,200,325 does not exclude the use of other rigid dielectric support circuits. Instead it is complementary, as can be seen in FIG. 3, in which there is a combination of a folded circuit with flexible support 11 and a non-folded circuit that could have a rigid support, permitting a greater variety and number of different architectures, since the service box is to be always adapted to the needs of limited volume and configuration of the space designed by the vehicle manufacturer for the assembly of such a box.

Other of the added advantages of this invention is that the thickness of the selected materials for the flexible supports is reduced compared to conventional arrangements. The intensive use of thinner substrates together with the integration techniques of this invention occupies less space and allows progressive miniaturization of the boxes, without hindering the combination of signal circuits with power circuits. Furthermore it is possible to use the combination of rigid and flexible circuits, that of the signal and power circuits with all the range of thickness of the conductive layers 12, from 35 up to 800 microns.

The present invention has been disclosed in an illustrative manner. It is understood that modifications regarded as convenient, always are possible without departing from the essence of the present invention as summarized in the following claims.

What is claimed is:

1. A printed circuit assembly comprising:

a single support substrate made from a flexible dielectric material;

a conductive layer that has a thickness of approximately 800 microns supported on said support substrate, said conductive layer including a plurality of tracks defining the operation of the circuit; and an adhesive disposed between said support substrate and said conductive layer and maintaining said conductive layer in place on said support substrate.

2. The assembly of claim 1, wherein said support substrate comprises a polyester material.

3. The assembly of claim 1, wherein said support substrate comprises a polyamide material.

* * * * *